(12) United States Patent
Park et al.

(10) Patent No.: US 7,740,515 B2
(45) Date of Patent: Jun. 22, 2010

(54) FLAT PANEL DISPLAY AND METHOD OF FABRICATING THE SAME

(75) Inventors: Sang-Il Park, Suwon-si (KR); Jae-Bon Koo, Seoul (KR); Hun-Jung Lee, Anyang-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 288 days.

(21) Appl. No.: 11/850,928

(22) Filed: Sep. 6, 2007

(65) Prior Publication Data

US 2008/0020500 A1    Jan. 24, 2008

Related U.S. Application Data

(62) Division of application No. 10/901,096, filed on Jul. 29, 2004, now Pat. No. 7,282,855.

(30) Foreign Application Priority Data

Aug. 7, 2003    (KR) .................. 10-2003-0054795

(51) Int. Cl.
    *H01J 9/24*    (2006.01)
(52) U.S. Cl. ..................... 445/24; 313/506; 313/509
(58) Field of Classification Search .............. 445/24; 313/506, 509
    See application file for complete search history.

(56) References Cited

U.S. PATENT DOCUMENTS 6,559,595 B1    5/2003    Inoue

| | | |
|---|---|---|
| 6,930,331 B2 | 8/2005 | Park et al. |
| 2004/0142502 A1 | 7/2004 | Yoo et al. |

FOREIGN PATENT DOCUMENTS

| | | |
|---|---|---|
| CN | 1430287 | 7/2003 |
| JP | 2001-125510 | 5/2001 |
| JP | 2001-214159 | 8/2001 |
| JP | 2002-108250 | 4/2002 |
| JP | 2003-031498 | 1/2003 |
| JP | 2003-058078 | 2/2003 |
| JP | 2003-084687 | 3/2003 |
| JP | 2003-123965 | 4/2003 |
| JP | 2003-197368 | 7/2003 |
| KR | 1020010012686 | 2/2001 |
| KR | 1020010075075 | 11/2001 |
| KR | 1020030044744 | 6/2003 |
| KR | 1020030051326 | 6/2003 |
| KR | 1020030054798 | 7/2003 |

*Primary Examiner*—Bumsuk Won
(74) *Attorney, Agent, or Firm*—H.C. Park & Associates, PLC

(57) ABSTRACT

A light-emitting display device the same includes an insulating substrate having a thin film transistor formed thereon. The thin film transistor includes a source electrode and/or a drain electrode. A passivation layer is formed on the insulating substrate over at least a portion of the thin film transistor, and has a via hole formed therein, which electrically contacts either the source electrode or the drain electrode. A pixel electrode is formed in the via hole. A light-blocking layer is formed over an entire upper surface of the passivation layer except for an area corresponding to the pixel electrode. A planarization layer is formed on an upper surface of the light-blocking layer except for an area corresponding to the pixel electrode.

3 Claims, 11 Drawing Sheets

FLAT PANEL DISPLAY AND METHOD OF FABRICATING THE SAME

CROSS-REFERENCE TO RELATED APPLICATION

This application is a divisional application of application Ser. No. 10/901,096, filed on Jul. 29, 2004, and claims priority to and the benefit of Korean Patent Application No. 10-2003-0054795, filed Aug. 7, 2003, which are all hereby incorporated by reference for all purposes as if fully set forth herein.

BACKGROUND OF THE INVENTION

1. Field of the Invention

The present invention relates to flat panel displays generally, and more particularly, to an organic light-emitting display (OLED) device and method of fabricating the same, which improves contrast by independently forming a light-blocking layer on an entire surface between a thin film transistor (TFT) and an electrode (EL) element.

2. Description of the Related Art

FIG. 1A is a top view of a portion 100 of a conventional active-matrix organic light emitting display device (AMOLED), illustrating red (R), green (G) and blue (B) unit pixels. FIG. 1B is a top view of a unit pixel 140 used in a portion 100 of the conventional AMOLED shown in FIG. 1A.

In order not to unnecessarily complicate FIG. 1A, reference numerals applicable to each of the R, G, B unit pixels are indicated on only the R unit pixel. However, it will be appreciated that the R, G, B unit pixels are identically configured.

Referring to FIGS. 1A and 1B, a conventional AMOLED illustrated thereby, includes a plurality of gate lines 110 insulated from each other and arranged in one direction; a plurality of data lines 120 insulated from each other and arranged in a direction crossing the gate lines 110; a plurality of power lines 130 insulated from each other, crossing the gate lines 110 and arranged in parallel with the data lines 120; a plurality of pixel portions 140 formed within an area enclosed by the gate lines 110, the data lines 120 and the power lines 130; and a plurality of pixel electrodes 150 arranged in each of the pixel portions 140 and having openings 155.

R, G and B unit pixels are arranged in each of the pixel portions 140, and each unit pixel includes two transistors 160 and 180, a capacitor 170 and an EL element having a pixel electrode 150. Also, there is provided a via hole 189 for connecting the pixel electrode 150 with a drain electrode 185 of the driving transistor 180.

The switching transistor 160 includes a semiconductor layer 161 having source/drain regions (not shown in the drawings), a gate electrode 163 connected to the gate line 110, and source electrode 167 and drain electrode 165 respectively connected to the source/drain regions of the semiconductor layer through contact holes 164 and 166. Also, there is provided a via hole for connecting the TFT 160 with drain electrode 165. The driving transistor 180 includes a semiconductor layer 181 having source/drain regions (not shown in the drawings), a gate electrode 183, source electrode 187, and drain electrode 185 respectively connected to the source/drain regions of the semiconductor layer 181 through contact holes 184 and 186.

The capacitor 170 includes a lower electrode 171 and an upper electrode 173. The lower electrode 171 is connected to the drain electrode 165 of the switching transistor 160 through a contact hole 166, and connected to gate electrode 183 of the driving transistor 180. The upper electrode 173 is connected to the power line 130 to which the source 187 of the driving transistor 180 is also connected. The pixel electrode 150 is connected to the drain electrode 185 of the driving transistor 180 through the via hole 189.

FIG. 2 is a cross-sectional view of portions of a conventional organic light-emitting OLED device that correspond to the driving transistor 180, the pixel electrode 150 and the capacitor 170 shown in FIG. 1B.

Referring to FIG. 2, a buffer layer 210 is formed on an insulating substrate 200, and a semiconductor layer 220 having source/drain regions 221 and 225 is formed on the buffer layer 210. A gate electrode 231 and a lower electrode 237 of a capacitor are formed on a gate insulating layer 230. Source/drain electrodes 251 and 255 are connected to the source/drain regions 221 and 225 through contact holes (not shown), and an upper electrode 257 of the capacitor is connected to each of the source/drain electrodes 251 and 255. In this example, upper electrode 257 is connected to the source electrode 251 formed on an interlayer insulating layer 240.

A passivation layer 260 and a planarization layer 265 are formed on an entire surface of the substrate. A lower electrode 270 (e.g., a pixel electrode) of an EL element is connected to one of the source/drain electrodes 251 and 255. In this example, lower electrode 270 is connected to the drain electrode 255 through a via hole 269 formed on the planarization layer 265. A pixel defining layer 275 has an opening 279 to expose a portion of the lower electrode 270. An organic emission layer 280 is formed in opening 279 and contacts lower electrode 270. An upper electrode 285 is formed on the entire surface of the substrate.

A conventional organic light-emitting OLED device having a structure as described above typically uses a polysilicon film TFT, and suffers decreased contrast when the EL element emits light. This reduction in contrast is caused by reflection of light off of a metal material within the OLED, such as a transistor, a capacitor, a wire, etc. In the case of mobile displays in particular, which are extensively exposed to exterior light, this is a serious problem because the contrast is drastically decreased by the internal reflections of the exterior light.

In order to prevent reduction of contrast due to the reflection of exterior light, an expensive polarizer is typically attached to a front surface of the display device. This leads to other problems in that addition of the expensive polarizer increases production costs. Moreover, the polarizer itself shields light emitted from the organic emission layer so that transmissivity is decreased, resulting in drastically reduced luminance.

Another conventional method forms a black matrix, composed of chromium (Cr)/chromium oxide (CrOx), or an organic layer, etc. on an area in which a TFT and a capacitor are formed. A significant disadvantage to this method is that a separate masking process is required to form the black matrix, resulting in a complex manufacturing process.

Where AMOLED devices are concerned, a method of forming the black matrix using a method that transforms the transmissivity of a transparent conductive layer was disclosed in Korean Patent Application Nos. 2002-0005435 and 2001-0075075. Although the techniques disclosed therein improved contrast and reduced the reflection of exterior light in bottom-emitting AMOLED devices, the problem caused by the reflection of the exterior light could not be solved in top-emitting AMOLED devices. Also, a metal layer used as a source or drain electrode, which forms an upper electrode of a capacitor, is highly reflective, and readily reflects exterior light.

In another case a black matrix was formed using a metal insulator hybrid layer (MIHL) in a top-emitting AMOLED but, because of a metal material in the MIHL, the black matrix had to be formed separately between pixels. Significant disadvantages of this method are that the black matrix does not completely shield the exterior light, and that an additional masking process is required to separate the black matrix between the pixels.

SUMMARY OF THE INVENTION

The present invention provides a top-emitting organic light-emitting display device (OLED) and method of fabricating the same which can improve contrast by minimizing reflectivity of exterior light.

An organic light-emitting display device and a method for fabricating the same is disclosed. In one embodiment, the device includes an insulating substrate having a thin film transistor formed thereon. The thin film transistor includes a source electrode and/or a drain electrode. A passivation layer is formed on the insulating substrate over at least a portion of the thin film transistor, and has a via hole formed therein, which enables electrical contacts either the source electrode or the drain electrode. A pixel electrode is formed in the via. A light blocking layer is formed over an entire upper surface of the passivation layer except for an area thereof corresponding to the pixel electrode. A planarization layer is formed on an upper surface of the light blocking layer except for an area thereof corresponding to the pixel electrode.

Figure 1A:
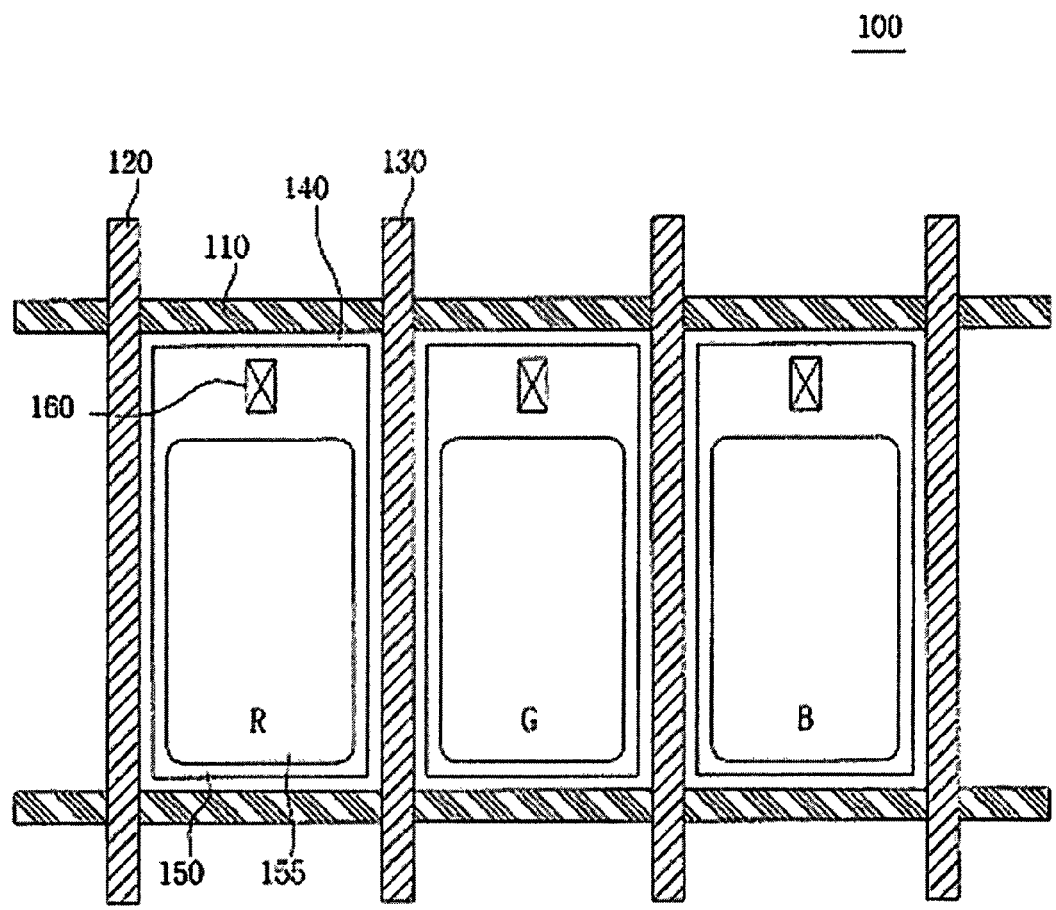
FIG. 1A is a top view of a portion of a conventional active-matrix organic light-emitting display (AMOLED) device.

In the drawings, the thickness of layers and regions are exaggerated for clarity.

DETAILED DESCRIPTION OF THE INVENTION

Figure 3:
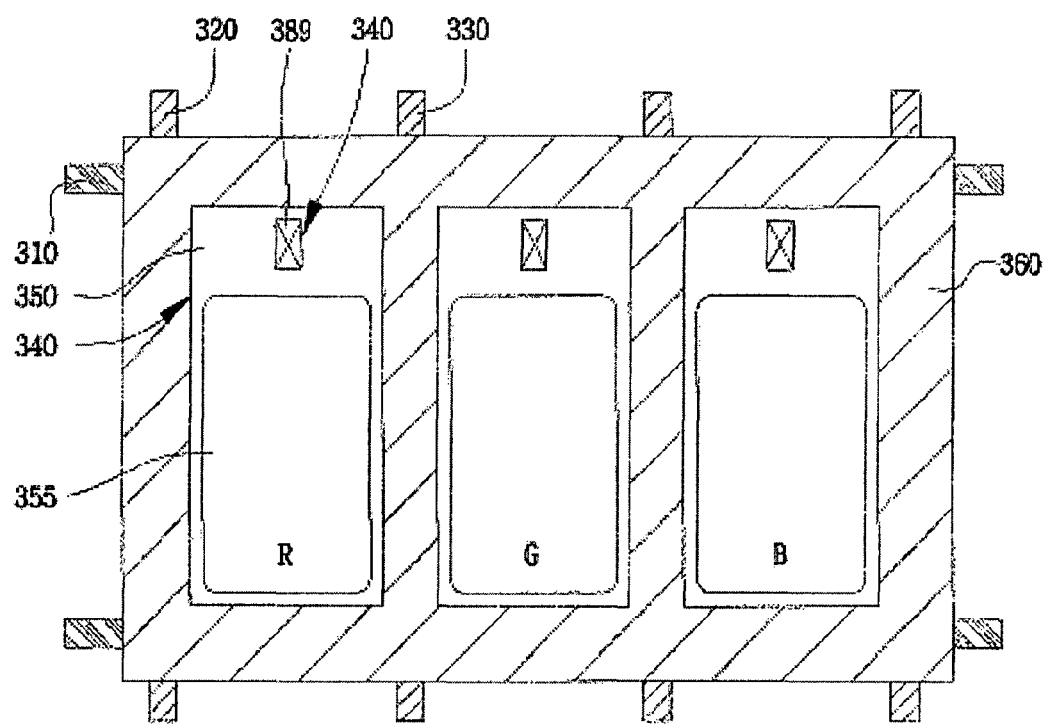
FIG. 3 is a top view of an AMOLED device, configured in accordance with one embodiment of the present invention.

FIG. 3 is a top view of a portion 300 of an AMOLED device, configured in accordance with an embodiment of the present invention, illustrating a configuration of red (R), green (G) and blue (B) unit pixels.

As FIG. 3 illustrates, a plurality of gate lines 310, insulated from each other, are arranged in one direction; a plurality of data lines 320, insulated from each other, are arranged in a direction crossing the gate lines 310; a plurality of power lines 330, also insulated from each other, cross the gate lines 310, and are arranged in parallel with the data lines 320, a plurality of pixel portions 340 are formed within an area bounded by the gate lines 310, the data lines 320, and the power lines 330; and a plurality of pixel electrodes 350 are arranged in each of the pixel portions 340 and have openings 355. In order not to unnecessarily complicate FIG. 3A, reference numerals applicable to each of the R, G, B unit pixels are indicated on only the R unit pixel. However, it will be appreciated that the R, G, B unit pixels may be similarly configured.

Figure 1B:
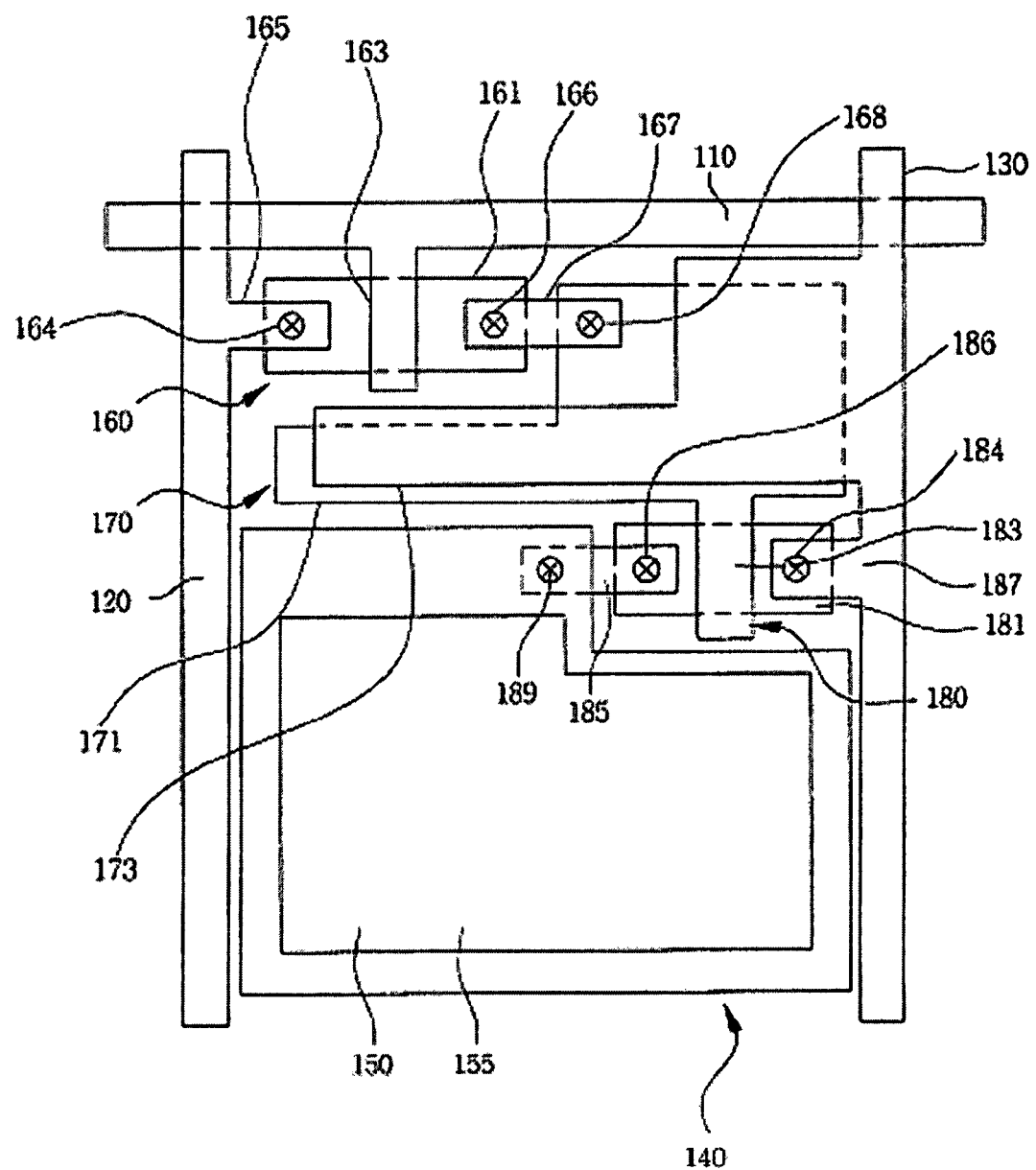
FIG. 1B is a top view of a unit pixel used in the portion of the AMOLED device shown in FIG. 1A.
Figure 2:
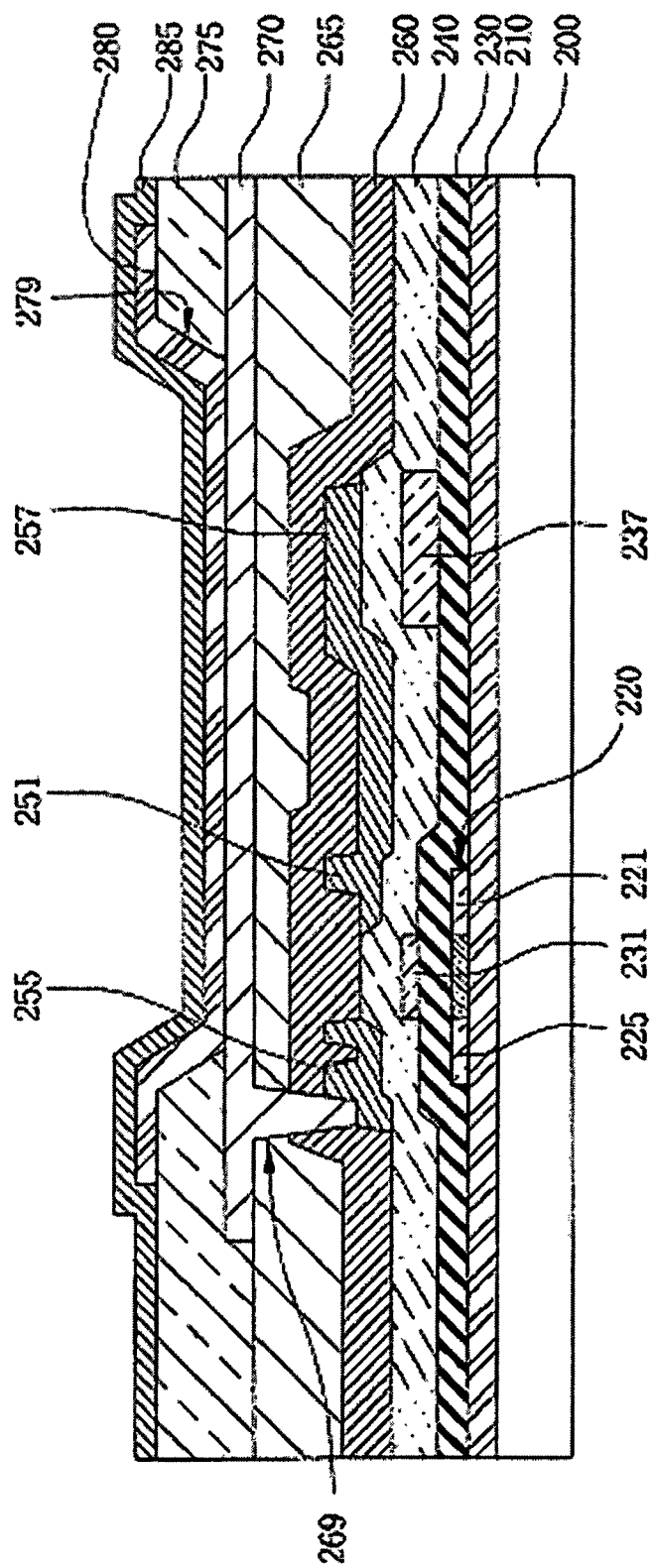
FIG. 2 is a cross-sectional view of a conventional unit pixel.

Each of the pixel portions 340 has a R, G or B unit pixel. Each unit pixel may have an EL element, which that includes the pixel electrode 350, a capacitor, and two transistors, as shown in FIG. 1B, or may be embodied in various other ways. In an exemplary embodiment, the pixel electrode 350 is a stacked layer that includes a reflection layer made of a metal or metal alloy such as aluminum (AL) or titanium (Ti), having high reflectivity, and a transparent conductive layer such as indium tin oxide (ITO). In this embodiment, reference numeral 389 indicates a via hole for connecting a driving transistor (not shown) with the pixel electrode 350.

In an embodiment of the present invention, there is provided an organic light-emitting display device further comprising a light-blocking layer 360 formed on an entire surface of a substrate, except for a portion thereof that corresponds to a pixel electrode. The light-blocking layer 360 can completely shield exterior light, since it is formed on an entire surface of the substrate except an area corresponding to the pixel electrode 350. In other words, because the light-blocking layer 360 is formed on the entire surface of the substrate under a planarization layer, and separated from the via hole 389 formed on the planarization layer, and because the pixel electrode 350 having the reflection layer is formed on the planarization layer, the light-blocking layer 360 can completely shield exterior light.

Figure 4A:
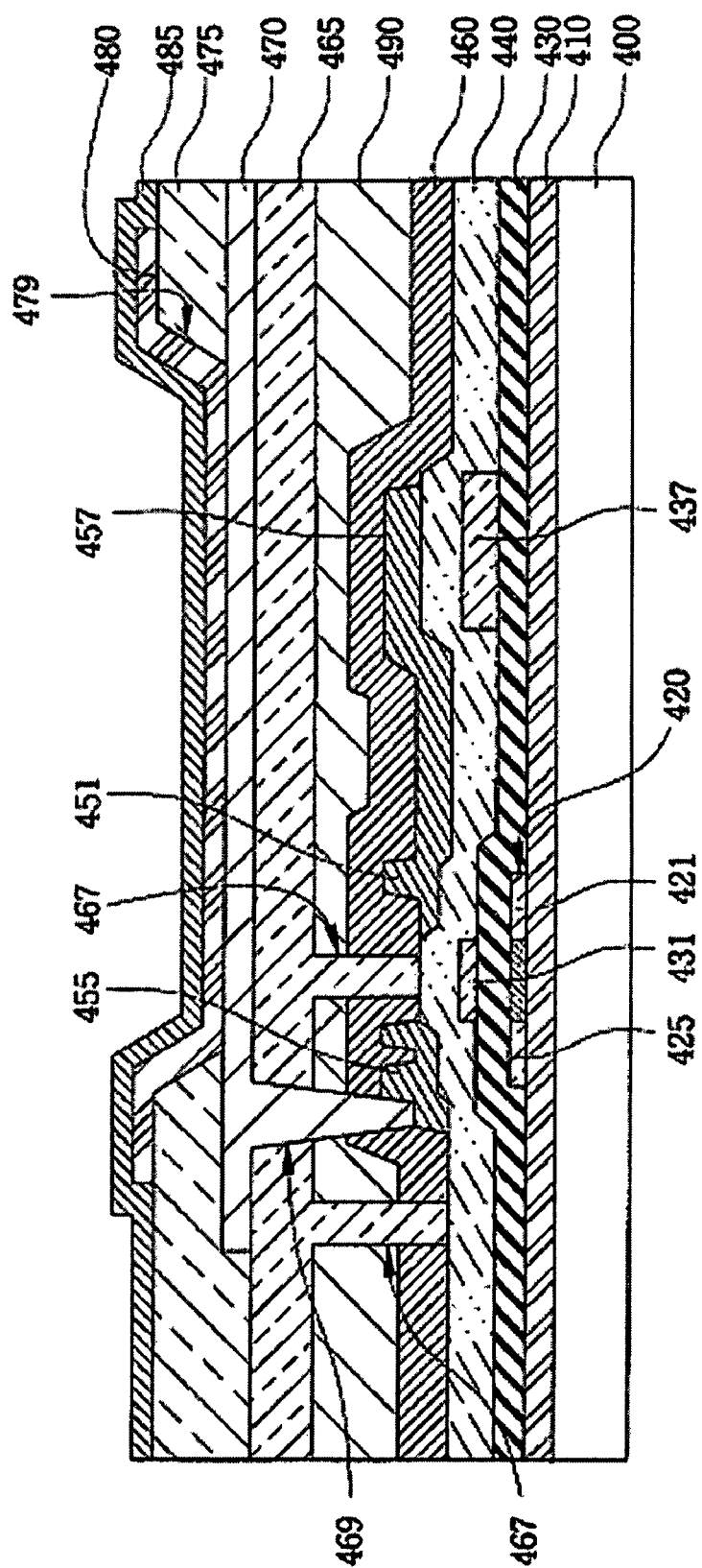
FIG. 4A is a cross-sectional view of an AMOLED device, configured in accordance with one embodiment of the present invention.

FIG. 4A shows a cross-sectional view of an AMOLED device, configured in accordance with one embodiment of the present invention, and illustrates a portion thereof having a capacitor, a transistor and an EL element connected to the transistor.

Referring to FIG. 4A, a buffer layer 410 is formed on an insulating substrate 400. A semiconductor layer 420 having source/drain regions 421 and 425 is formed on the buffer layer 410, and a gate electrode 431 and a lower electrode 437 of the capacitor are formed on a gate insulating layer 430. On an interlayer insulating layer 440, there are formed source/drain electrodes 45 1and 455, which are connected to the source/drain regions 421 and 425 through via holes (not shown). An upper electrode 457 of the capacitor is connected to one of the source/drain electrodes 451 and 455. In this example, the upper electrode 457 is connected to the source electrode 451.

A passivation layer 460 is formed on an entire surface of the substrate, a light-blocking layer 490 is formed on the passivation layer 460, and a planarization layer 465 is formed on the light-blocking layer 490. A via hole 469 is formed through the light blocking layer 490 and the planarization layer 465, to expose the drain electrode 455 formed in contact with passivation layer 460. And, a light-blocking shield 467 is formed, extending substantially circumferentially and vertically downwards, from the planarization layer 465 through the light blocking layer 490 and the passivation layer 460 to enclose via hole 469, thereby separating the via hole 469 from the light-blocking layer 490 and the passivation layer 460. In this manner, the light blocking layer 490 is separated from the via hole 469 and insulated from the lower electrode 470 by the defining pattern 467. Additionally, in one embodiment, the light blocking layer 490 is formed on an entire surface (layer) between the EL element and a TFT.

A lower electrode 470, which is a pixel electrode of the EL element, is connected to the drain electrode 455 through the via hole 469 formed through the planarization layer 465. A pixel defining layer 475 having an opening 479 therein to expose a portion of the lower electrode 470 is formed. An organic emission layer 480 is formed in the opening 479 to contact the lower electrode 470. An upper electrode 485 is formed on an entire surface of the substrate.

In one exemplary embodiment, the light blocking layer 490 is a thin film layer formed of a metal insulator hybrid layer (MIHL) having a concentration gradient of a metal material and a concentration gradient of a transparent insulation material, such as a nitride layer or an oxide layer. The MIHL may have a concentration gradient of a metal material, such as indium tin oxide (ITO) or indium zinc oxide (IZO), and a concentration gradient of a transparent conductive material such as indium tin oxide (ITO). Alternatively, the light blocking layer 490 may have a concentration gradient of an organic insulating layer such as, but not limited to, Cr, CrOx, or carbon black. The thin film is formed so that concentration of the metal material gradually increases toward the passivation layer 460 while concentration of the transparent material gradually increases toward the planarization layer 465.

Formed in a closed groove shape through the light blocking layer 490 and the passivation layer 460, the light-blocking shield 467 is filled with an insulating material that forms planarization layer 465, so that, if the light-blocking layer 490 is formed of a conductive material, the light-blocking layer 490 will be separated from the via hole 469. In this manner, a short-circuit to the pixel electrode 470 is prevented, because the light-blocking layer 490 is separated by the light-blocking shield 467 from the pixel electrode formed in the via hole 469, (e.g. lower electrode 470).

Because the light blocking layer 490 is formed on the entire surface of the substrate except areas thereof corresponding to via hole 469, surrounded by and because the pixel electrode having the reflection layer is the light-blocking shield 467, all exterior light can be shielded throughout the entire surface of the substrate.

Figure 4B:
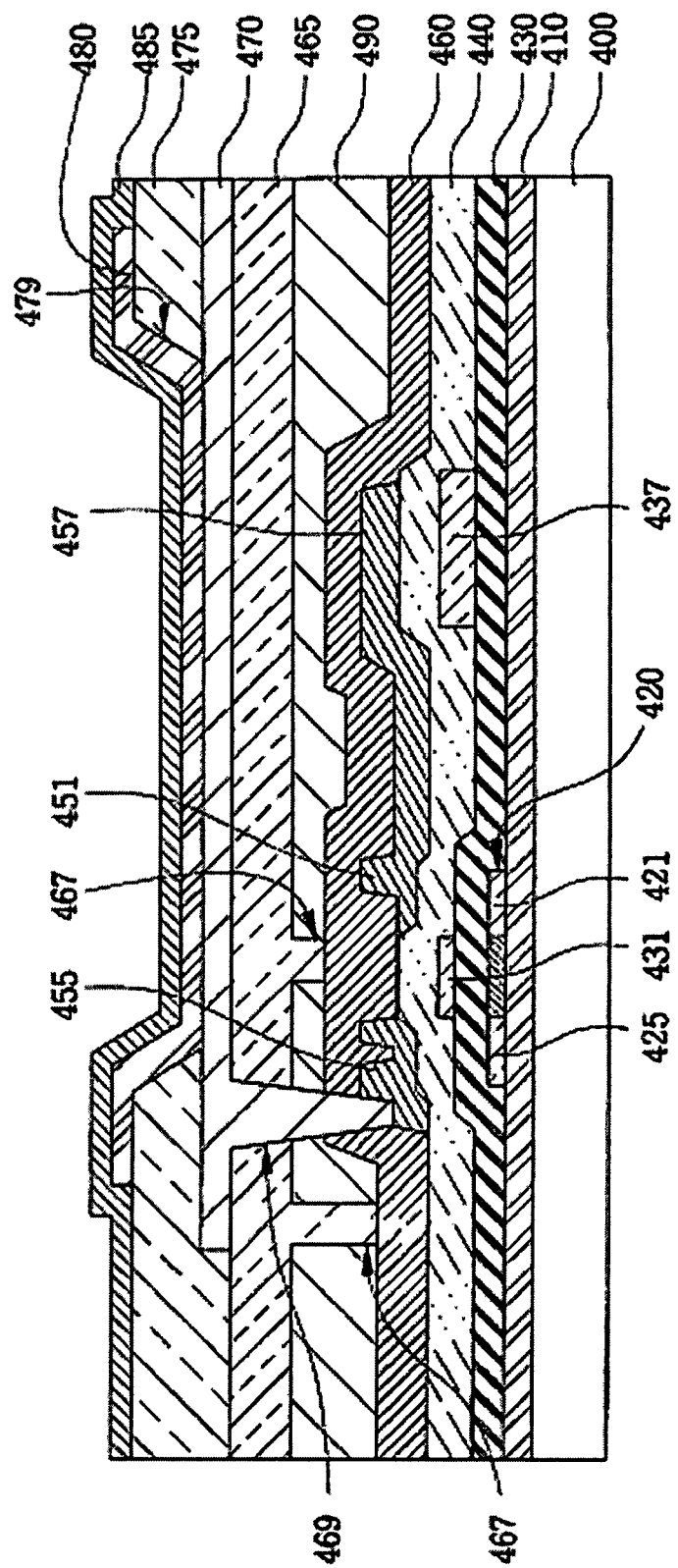
FIG. 4B is a cross-sectional view of an AMOLED device, configured in accordance with another embodiment of the present invention.

FIG. 4B is a cross-sectional view of a portion of an AMOLED organic light-emitting device, configured in accordance with another embodiment of the present invention, which includes a capacitor, a TFT, and an EL element connected to the TFT.

The portion of the AMOLED device of FIG. 4B mirrors the portion of the AMOLED illustrated in FIG. 4A, except that the light-blocking shield 467 separating the via hole 469 from the light blocking layer 490 is formed only through the light-blocking layer 490. In this embodiment, the effect of forming the light-blocking layer 490 on the entire surface of the substrate is the same as in the case of the embodiment described with reference to FIG. 4A.

FIGS. 5A, 5B, 5C and 5D are sequential cross-sectional views illustrating a method for fabricating an AMOLED device, in accordance with an embodiment of the present invention. Because the process of fabricating the source/drain electrodes in all the methods herein described is similar to those used to form conventional source/drain electrodes, the following explanation will start from a process of fabricating a passivation layer.

Figure 5A:
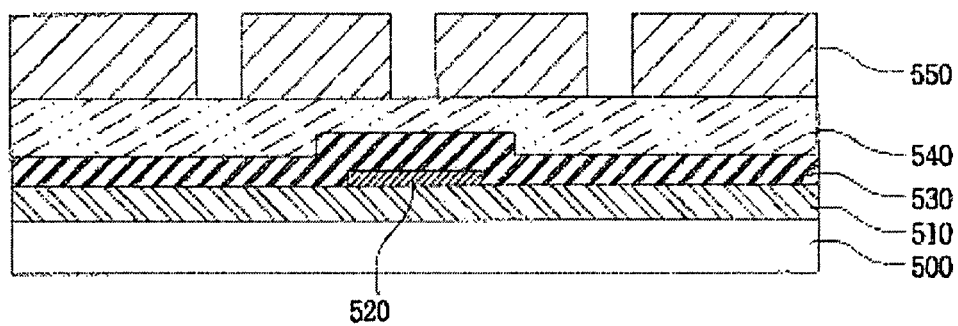
FIGS. 5A, 5B, 5C and 5D are sequential cross-sectional views illustrating a method for fabricating an organic light-emitting display device, in accordance with one embodiment of the present invention.

Referring to FIG. 5A, after source/drain electrodes 520 are formed on an interlayer insulating layer 510 of an insulating substrate 500, a passivation layer 530 and a light-blocking layer 540 are successively formed on the insulating substrate 500. Thereafter, a photosensitive layer pattern 550 is formed so that a portion of the light-blocking layer 540 on which a via hole and a light-blocking shield are formed may be exposed.

Figure 5B:
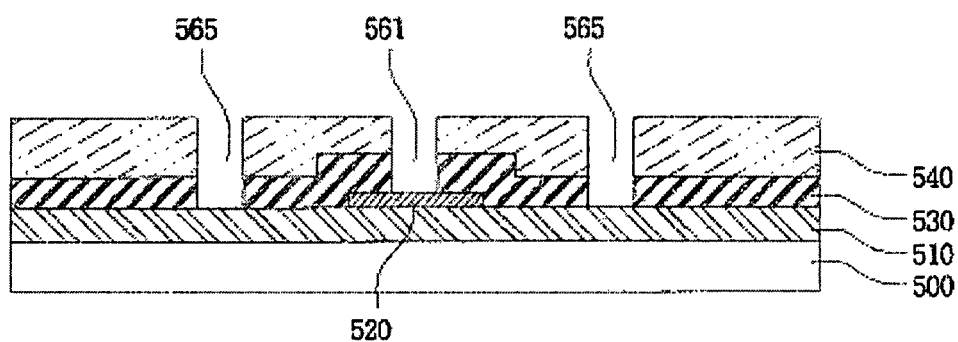

Referring to FIG. 5B, a via hole 561 to expose the source/drain electrodes 520 is firstly formed by etching the exposed light-blocking layer 540 using the photosensitive layer pattern 550 (FIG. 5A) as a mask. In similar fashion, light-blocking shield 565 is formed in contact with the light blocking layer 540 and the passivation layer 530. Thereafter the photosensitive layer pattern 550 is removed.

Figure 5C:
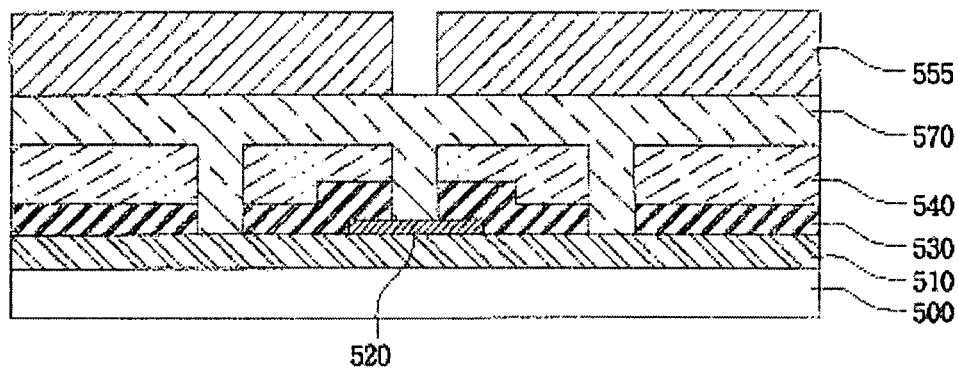

Referring to FIG. 5C, a planarization layer 570 is formed on an entire surface of the substrate. Then a photosensitive layer pattern 555 is formed to expose an area of the planarization layer 570 corresponding to the previously formed via hole 561.

Figure 5D:
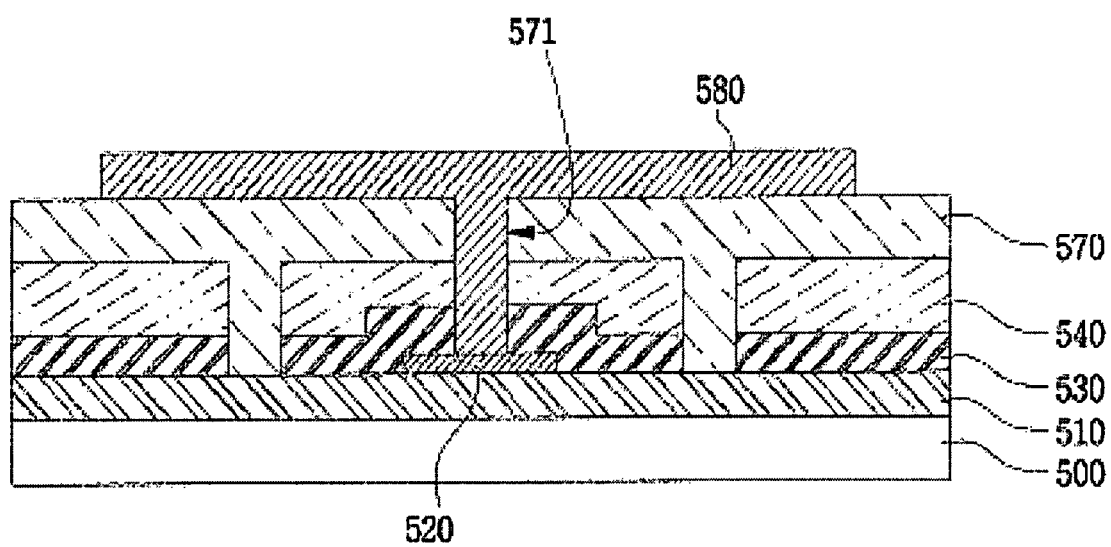

Referring to FIG. 5D, a via hole 571 to expose the source/drain electrodes 520 is formed through the passivation layer 530, the light-blocking layer 540 and the planarization layer 570 by etching the exposed planarization layer 570 using the photosensitive layer pattern 555 as a mask. After the photosensitive layer pattern 555 is removed, lower electrode 580 is formed on the planarization layer 570 and connected to the source/drain electrodes 520 through the via hole 571.

When the light-blocking layer 540 is formed on the entire surface of the substrate as described above and no light-blocking shield is provided, the lower electrode 580 is electrically connected to the light-blocking layer 540 through the via hole 571 and a short-circuit would occur. However, in the present invention, the via hole 571 is separated from the light-blocking layer 540 by the light-blocking shield 565, which is filled with the planarization material 570, so that no short-circuit occurs between the lower electrode 580 and the light-blocking layer 540.

Furthermore, in an embodiment of the present invention, when a via hole 571 is formed in the passivation layer 530 and the planarization layer 570, an additional masking process can be omitted by forming the light-blocking shield 565 at about the same time. In a case where a conventional AMOLED uses a planarization layer, the planarization layer is formed on the passivation layer 530 in order to overcome step differences of the substrate 500 on which TFTs are formed (hereinafter TFT substrate). To enhance adhesion between the TFT substrate and a sealing substrate (not shown in the drawings), a portion of the planarization layer is removed so that the TFT substrate seals with the sealing substrate. Thus in a conventional configuration where a planarization layer is formed on the passivation layer, two kinds of masking processes are necessary. One is the process of forming a via hole, and the other is the process of removing a region of the planarization layer that is used to seal the planarization layer to the sealing substrate.

In an embodiment of the present invention, however, after the via hole and the light-blocking shield are firstly formed by etching the light blocking layer and the passivation layer, the planarization layer is etched during the process for forming the via hole in the passivation layer. As a result, an additional masking process for forming the light-blocking shield is not required.

FIGS. 6A, 6B, 6C and 6D are sequential cross-sectional views illustrating a method for fabricating an AMOLED device, in accordance with another embodiment of the present invention.

Figure 6A:
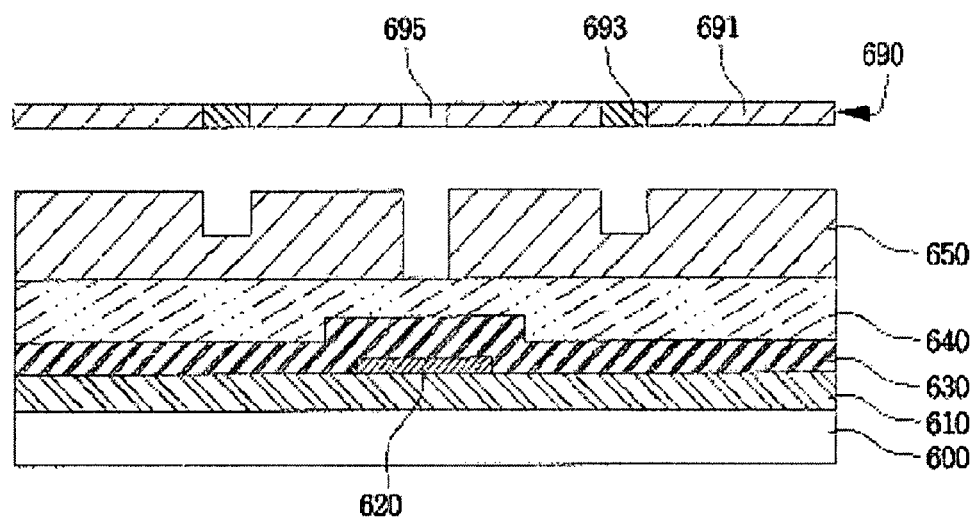
FIGS. 6A, 6B, 6C and 6D are sequential cross-sectional views illustrating a method for fabricating an organic light-emitting display device, in accordance with another embodiment of the present invention.

Referring to FIG. 6A, after source/drain electrodes 620 are formed on an interlayer insulating layer 610 of an insulating substrate 600, a passivation layer 630 and a light-blocking layer 640 are successively formed. Thereafter, a photosensitive layer pattern 650 is formed on the light-blocking layer 640. In this case, the photosensitive layer 650 is configured so that a first portion of the light-blocking layer 640 where a via hole will be formed is exposed lies within a second portion where a light-blocking shield will be formed. This configuration is accomplished using a halftone mask 690 in which a transparent pattern 695 is formed on a portion corresponding to the via hole, a translucent pattern 693 is formed on a portion corresponding to the light-blocking shield, and a shielding pattern 691 is formed on a remaining portion.

Figure 6B:
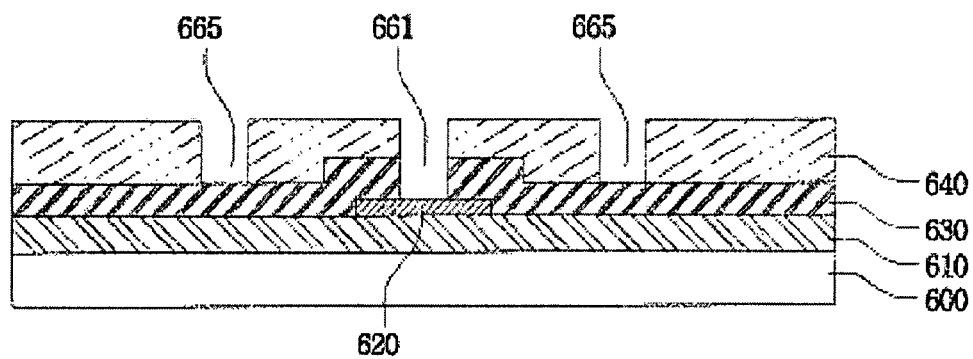

Referring to FIG. 6B, a via hole 661 to expose the source/drain electrodes 620 is firstly formed in contact through the light-blocking layer 640 and the passivation layer 630 by etching the exposed light-blocking layer 640 using the photosensitive layer pattern 650 as a mask while a light-blocking shield 665 is formed on the light-blocking layer 640 at about the same time. Then the photosensitive layer pattern 650 is removed.

Figure 6C:
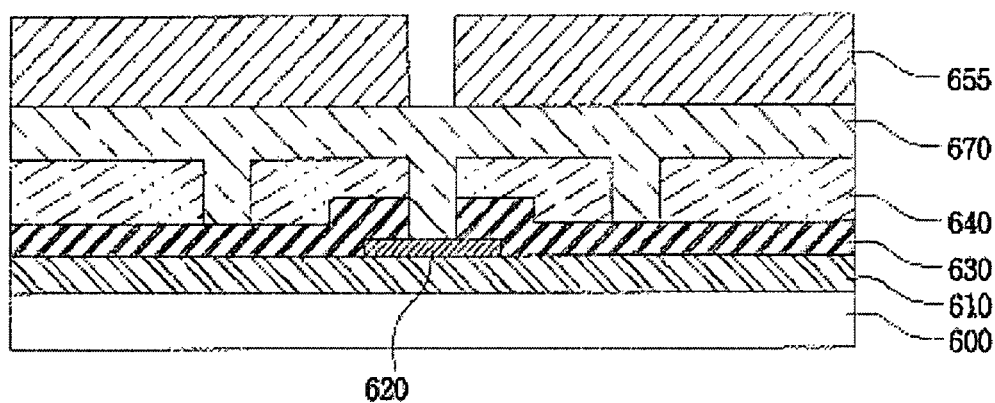

Referring to FIG. 6C, after a planarization layer 670 is formed on an entire surface of the substrate, there is formed a photosensitive layer pattern 655 to expose a portion of the planarization layer 670 that corresponds to the via hole 661 formed at first.

Figure 6D:
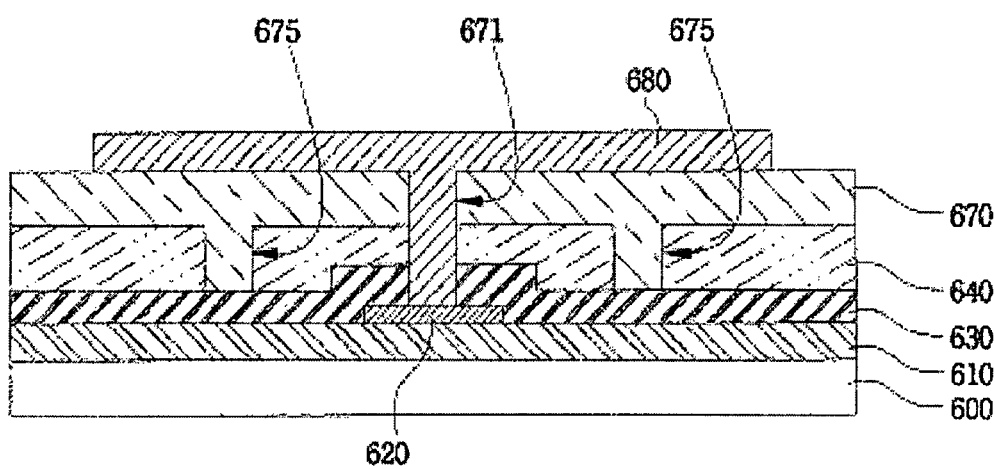

Referring to FIG. 6D, a via hole 671 to expose the source/drain electrodes 620 is finally formed contacting through the passivation layer 630, the light-blocking layer 640 and the planarization layer 670 by etching the exposed planarization layer 670 using the photosensitive layer pattern 655 as a mask. After the photosensitive layer pattern 655 is removed, there is formed a lower electrode 680 connected to the source/drain electrodes 620 through the via hole 671.

According to another embodiment of the present invention, the via hole 671 is separated from the light-blocking layer 640 by a light-blocking shield 675 formed on the light-blocking layer 640, so that a short-circuit between the lower electrode and the light-blocking layer is prevented. Furthermore, an additional masking process can be omitted by forming the light-blocking shield when the via hole 671 is formed.

Figure 7A:
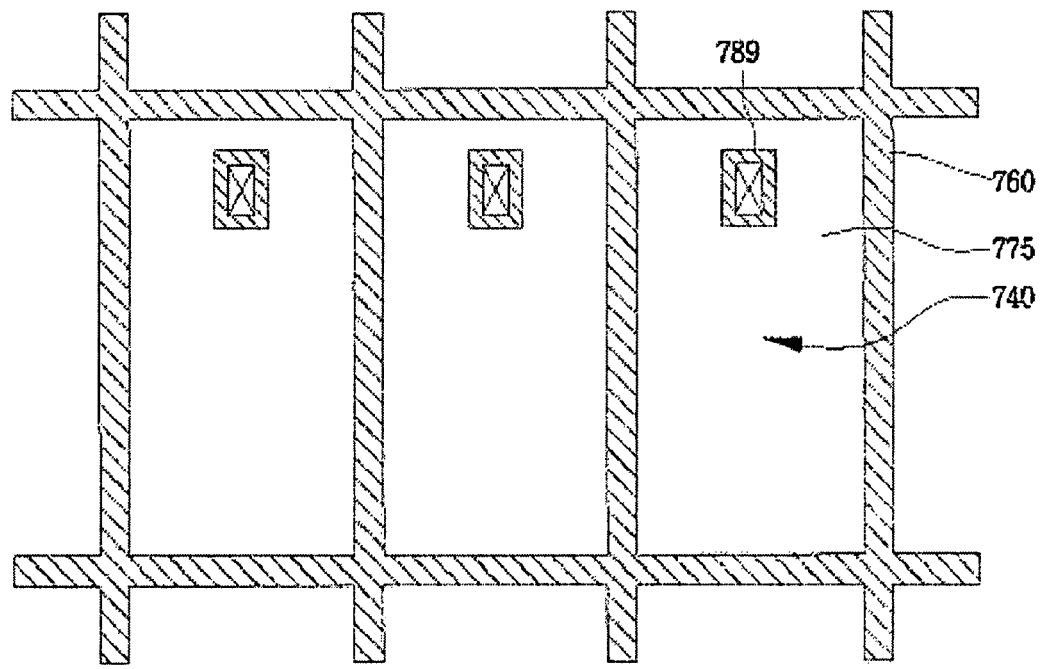
FIGS. 7A and 7B are diagrams illustrating an example of forming a light-blocking layer in an AMOLED device, configured in accordance with the present invention.
Figure 7B:
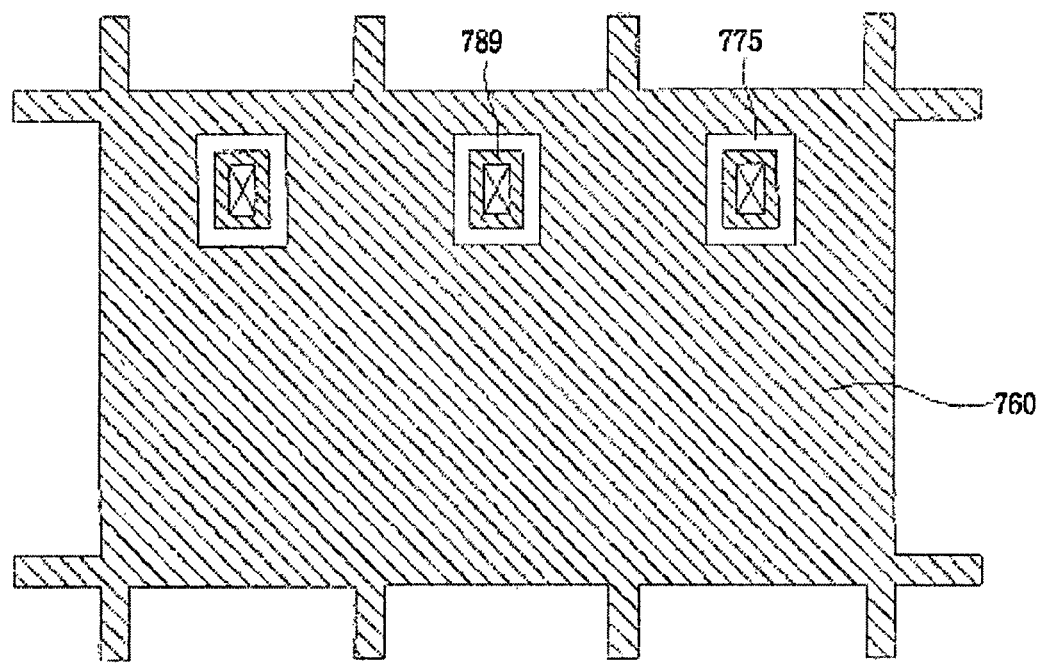

FIGS. 7A and 7B are diagrams showing a relationship between a light-blocking layer and a light-blocking shield according to an embodiment of the present invention.

Referring to FIGS. 7A and 7B, a light-blocking shield 760 is formed on an entire surface of a substrate (a pixel portion 740) except for a via hole 789. Additionally, a light-blocking shield 760 is formed in a groove shape about and enclosing the via hole 789. In addition to the light-blocking shield described herein, any pattern that can separate the via hole 789 from the light-blocking layer is within the spirit and scope of the invention as claimed.

Although the present invention described herein is explained using exemplary embodiments, the invention may be modified without departing from the spirit and scope of the invention as claimed.

What is claimed is:

1. A method for fabricating a flat panel display, comprising:
   forming a passivation layer over an entire surface of a substrate;
   forming a light-blocking layer on an entire surface of the passivation layer;
   forming a mask layer on the light-blocking layer, the mask layer having one or more regions corresponding to a first via hole and to a light-blocking shield recess; and
   etching the light-blocking layer and the passivation layer to form therein the first via hole and the light-blocking shield recess, wherein both the first via hole and the light-blocking shield recess expose the light-blocking layer.

2. The method of claim 1, further comprising:
   forming a second insulating layer on an entire surface of the light-blocking layer including the first via hole and the light-blocking shield recess;
   forming a second mask layer on the second insulating layer, the second mask layer including a region corresponding to the first via hole; and
   etching a region of the second insulating layer corresponding to the first via hole.

3. The method of claim 2, further comprising forming a pixel electrode in the first via hole, connecting to a first electrode through the first via hole.

* * * * *